(12) United States Patent
Solvin et al.

(10) Patent No.: US 8,599,636 B2
(45) Date of Patent: Dec. 3, 2013

(54) BOOSTING MEMORY MODULE PERFORMANCE

(75) Inventors: Daniel Solvin, Fremont, CA (US);
Martin Mueller, Fremont, CA (US);
Donald Lieberman, San Jose, CA (US);
John Beekley, Danville, CA (US)

(73) Assignee: Corsair Memory, Inc., Fremont, CA (US)

( * ) Notice: Subject to any disclaimer, the term of this patent is extended or adjusted under 35 U.S.C. 154(b) by 0 days.

(21) Appl. No.: 13/310,654

(22) Filed: Dec. 2, 2011

(65) Prior Publication Data

US 2013/0141991 A1      Jun. 6, 2013

(51) Int. Cl.
*G11C 5/14*      (2006.01)

(52) U.S. Cl.
CPC ...................................... *G11C 5/147* (2013.01)
USPC ................. 365/226; 365/189.07; 365/189.09; 365/191

(58) Field of Classification Search
CPC ...... G11C 11/4047; G11C 5/14; G11C 5/148; G11C 7/00
USPC ........................ 365/226, 189.07, 189.09, 191
See application file for complete search history.

(56) References Cited

U.S. PATENT DOCUMENTS

2006/0174140 A1 *   8/2006   Harris et al. .................. 713/300

* cited by examiner

*Primary Examiner* — Thong Q Le
(74) *Attorney, Agent, or Firm* — Carina M. Tan; Reed Smith LLP

(57) ABSTRACT

Power supplied to a memory module is provided. A first voltage is supplied to a first power distribution pathway, the first voltage being from a voltage supplied to a printed circuit board on which the memory module resides. A second voltage is generated, the second voltage being generated by a voltage regulator. The second voltage is supplied to a second power distribution pathway.

26 Claims, 15 Drawing Sheets

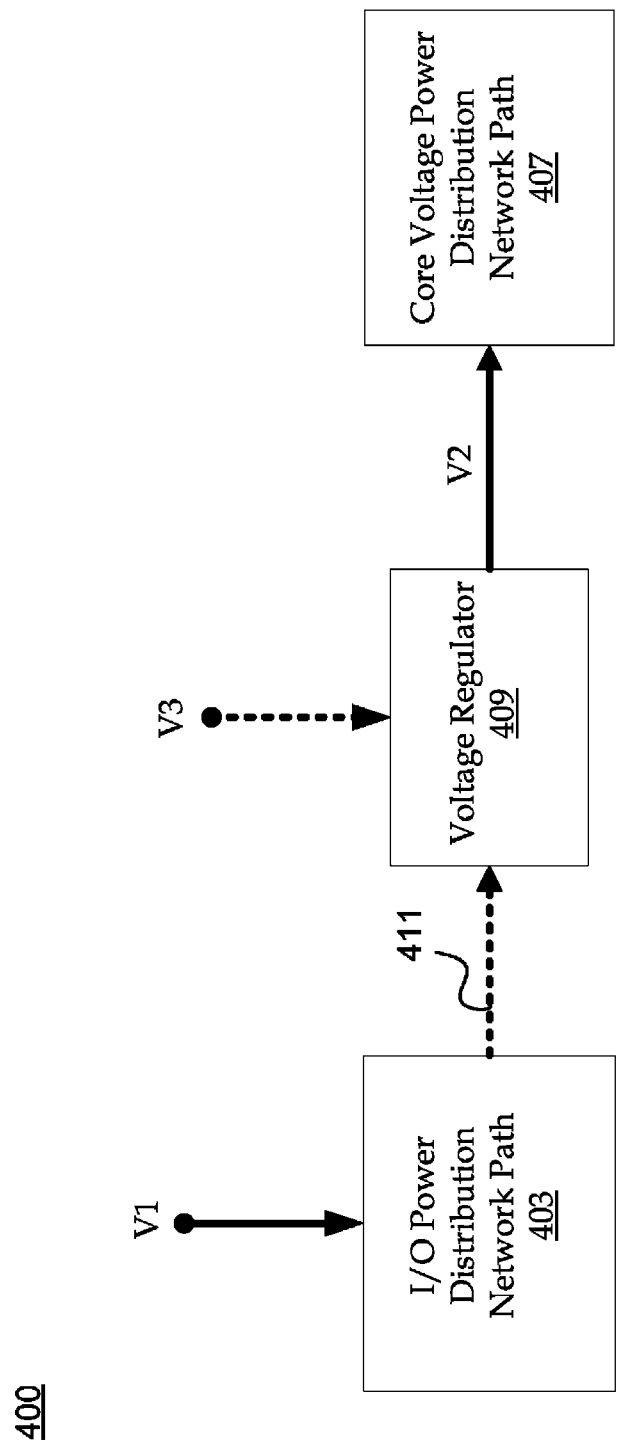

BOOSTING MEMORY MODULE PERFORMANCE

TECHNICAL FIELD

The disclosed subject matter relates generally to memory modules, and more specifically to adjusting core voltage levels of memory modules.

BACKGROUND

Present day personal computers require vast amounts of memory to support application software. Certain segments of the user community are not satisfied with mere memory capacity alone. This population requires the utmost performance from their memory subsystems. They typically elect to exploit the flexibility inherent in certain computer systems to operate the memory above and beyond its factory rated frequency, a technique called "over clocking". The problem, however, is that current over clocking techniques typically require the voltage to the memory to be increased, which results in the interface voltage applied to any device connected to the memory to be increased as well. This increase in voltage can cause the device connected to the memory to overheat and/or become permanently damaged.

BRIEF DESCRIPTION OF THE DRAWINGS

For a better understanding of the subject matter described herein, reference should be made to the Detailed Description below in conjunction with the following drawings in which like reference numerals refer to corresponding parts throughout the figures.

FIGS. 4A-4D are block diagrams illustrating various memory sub-systems and/or memory modules including an on-board voltage regulator, according to certain embodiments.

DETAILED DESCRIPTION

Figure 1:
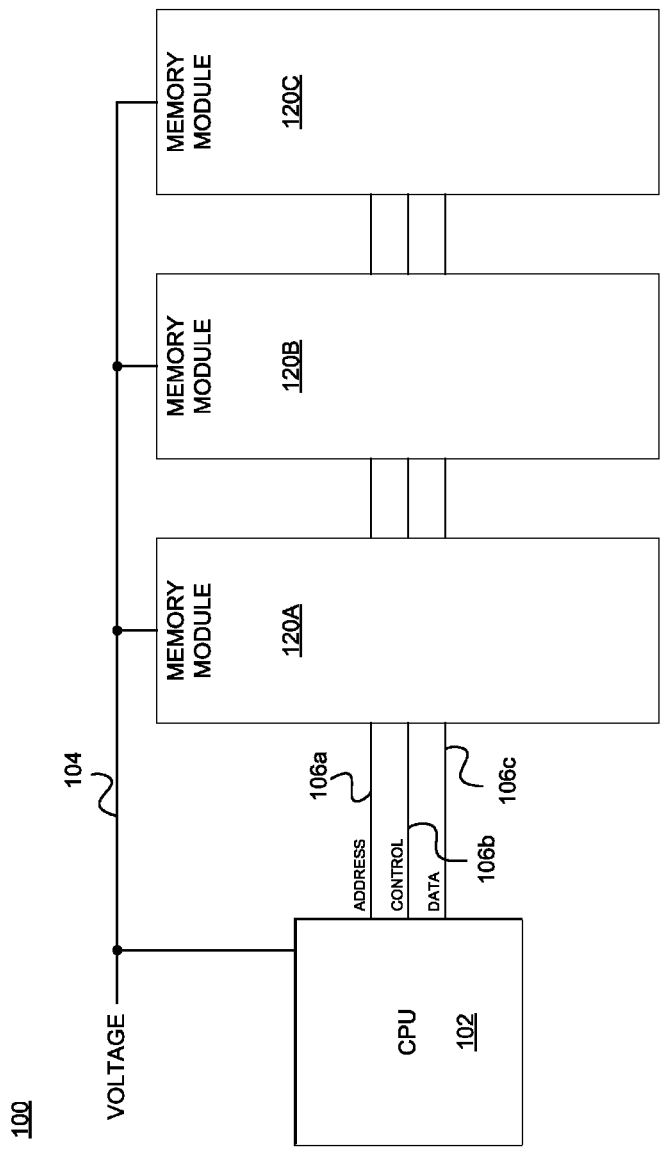
FIG. 1 is a block diagram illustrating a memory sub-system of a computer device, according to certain embodiments.

In the following Detailed Description, reference is made to the accompanying drawings, which form a part hereof. In the drawings, similar symbols typically identify similar components, unless context dictates otherwise. The illustrative examples described in the Detailed Description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are implicitly contemplated herein.

Moreover, in the following Detailed Description, numerous specific details are set forth to provide a thorough understanding of the disclosed subject matter. However, it will be apparent to one of ordinary skill in the art that the disclosed subject matter may be practiced without these particular details. In other instances, methods, procedures, and components that are well known to those of ordinary skill in the art are not described in detail to avoid obscuring aspects of the present disclosure.

FIG. 1 is a block diagram illustrating a memory sub-system 100 of a computer device, according to certain embodiments. The memory sub-system 100 includes a central processing unit ("CPU") 102 coupled to a plurality of memory modules 120 via busses 106. Memory modules 120A-C may house any memory device or devices in any configuration. One common memory device may be a dynamic random-access memory ("DRAM"), but other memory devices or combination of memory devices may be utilized. Other devices include, but are not limited to, Rambus DRAM, SRAM, ROM (e.g., PROM, EPROM, EEPROM, etc.), flash memory, Memristor, and so on.

Each memory module 120 may house a single memory device or a combination of devices, which can be 8 or 16 devices, for example. Computer systems that include the memory sub-system 100 can incorporate such memory modules 120 into an array. For example, arrays inside personal computers may consist of between two and eight memory modules, although other configurations are possible. Latest generation personal computer systems have their DRAM memory controllers incorporated into the main CPU. Thus, there is a direct electrical interconnect between the CPU 102 and the memory devices on each memory module 120. The sub-system 100 shown in FIG. 1 may be such a PC memory sub-system.

The CPU 102 is electrically connected to the memory modules 120A-C via three busses: an address bus 106a, a control bus 106b, and a data bus 106c. The address bus 106a may be sufficiently wide to allow addressing of the largest memory devices that are expected to be available for a particular generation of computers being serviced. The control bus 106b distributes critical timing signals that are used to regulate the data flow between the memory modules 120 and the CPU 102. The data bus 106c may be any width, for example 64 bits wide and, in certain higher end implementations, 128 bits wide. A common voltage is distributed to both the CPU 102 and the memory modules 120A-C via connector 104 such that all three busses 106 transfer information at the same voltage levels and ensure signal level compatibility.

Figure 2:
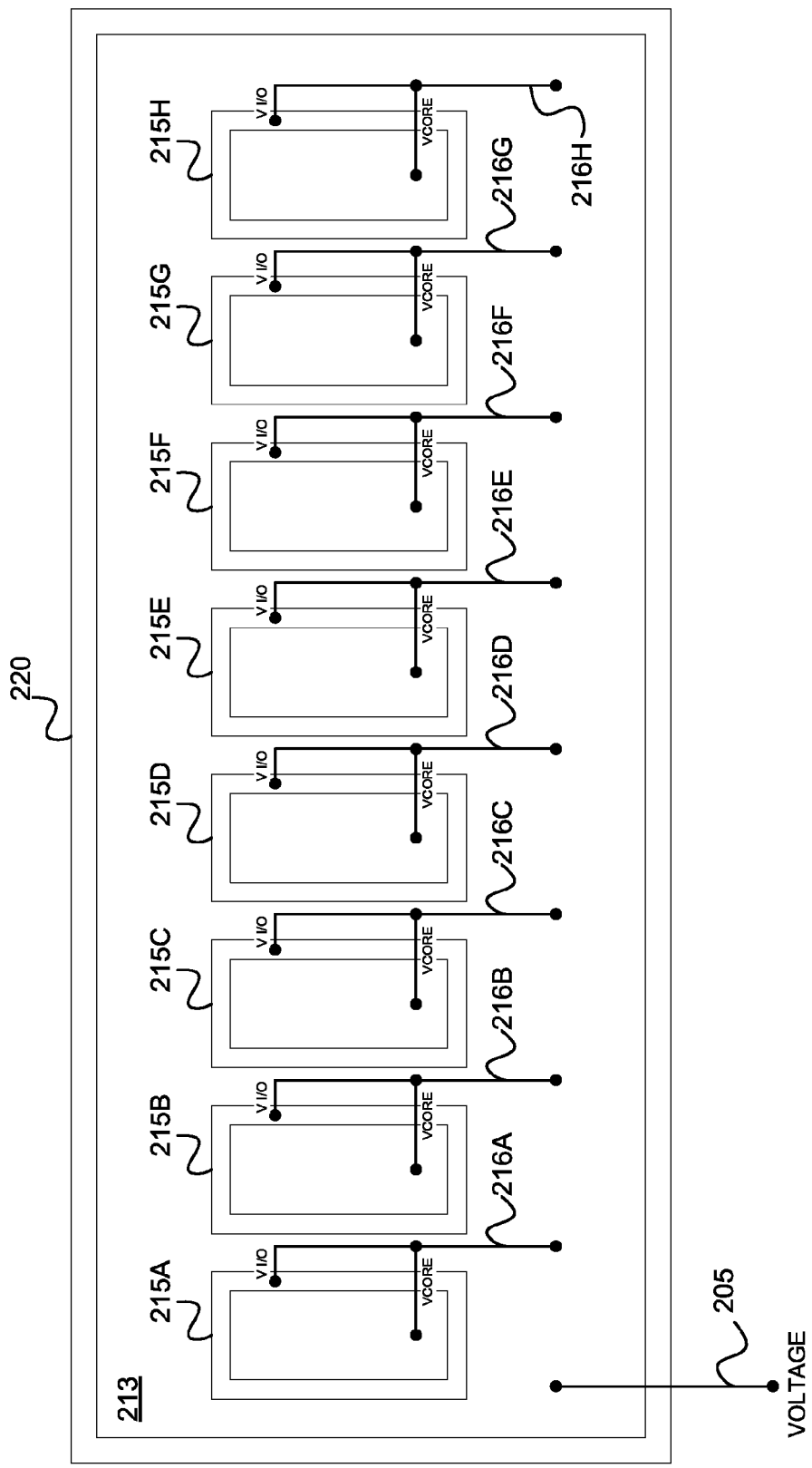
FIG. 2 is a block diagram illustrating the power distribution of a memory module, according to certain embodiments.

FIG. 2 is a block diagram illustrating the power distribution of a memory module 220, according to certain embodiments. Memory module 220 may be any one of the memory modules 120 A-C of FIG. 1. Memory module 220 includes DRAM devices 215 A-h, although other types of memory devices or combination of different devices can be used. Memory devices 215 are made, for example, by integrating billions of transistors, such as CMOS transistors, on a single integrated circuit die. Such die are molded into plastic packages that create integrated circuits and that can be soldered onto a printed circuit board ("PCB"), which form a memory module, such as memory module 220.

In some embodiments, the memory module 220 may include a buffer (not shown) coupled to memory busses, such as busses 106 of FIG. 1, and to the plurality of memory devices 215 A-H.

DRAM integrated circuits, such as memory devices 215, may be configured with two separate internal power distribution structures. One power distribution structure supplies an operating voltage to the core of the DRAM die, e.g., that portion which is devoted to the actual storage of information. The other power distribution structure supplies an operating voltage to the periphery of the memory device 215, the so called Input/Output ("I/O") portion, which is devoted to communicating with other devices in the system, such as memory sub-system 100 of FIG. 1 or beyond. Despite the separation of the two power distribution structures on the memory devices 215, the two structures may be connected together on the memory module's PCB power plane 213.

Operating power is distributed to the memory devices 215 on the memory module 220 by applying a common source voltage VOLTAGE (via a connector 205) to the memory module PCB power plane 213. The power plane 213, in turn, distributes the voltage to each of the memory device 215 soldered to the PCB power plane 213 via power pathways 216. Each memory device 215A-H requires a core voltage ("VCore") and an I/O Voltage ("VI/O"). This example shows both VCore and VI/O voltages supplied from the common source voltage VOLTAGE via power pathways 205 and 216 on the memory module PCB power plane 213. In other words, the applied voltage is distributed to each memory device's 215 core and periphery via the PCB power plane 213.

In some embodiments, there is a direct electrical interconnect between the CPU (not shown) and the memory device 215 in some systems. As a result, the I/O structures inside the CPU are directly interconnected to the I/O structures inside the memory device 215 integrated circuits. Furthermore, since the two die power distribution pathways of the memory device 215 may be interconnected (e.g., via power pathways 216A-H) on the memory module PCB's power plane 213, the integrated circuitry's core voltages of the memory devices 215 may operated at the same voltage as the CPU/DRAM I/O interconnect pathway, such as power pathway 216.

Figure 3:
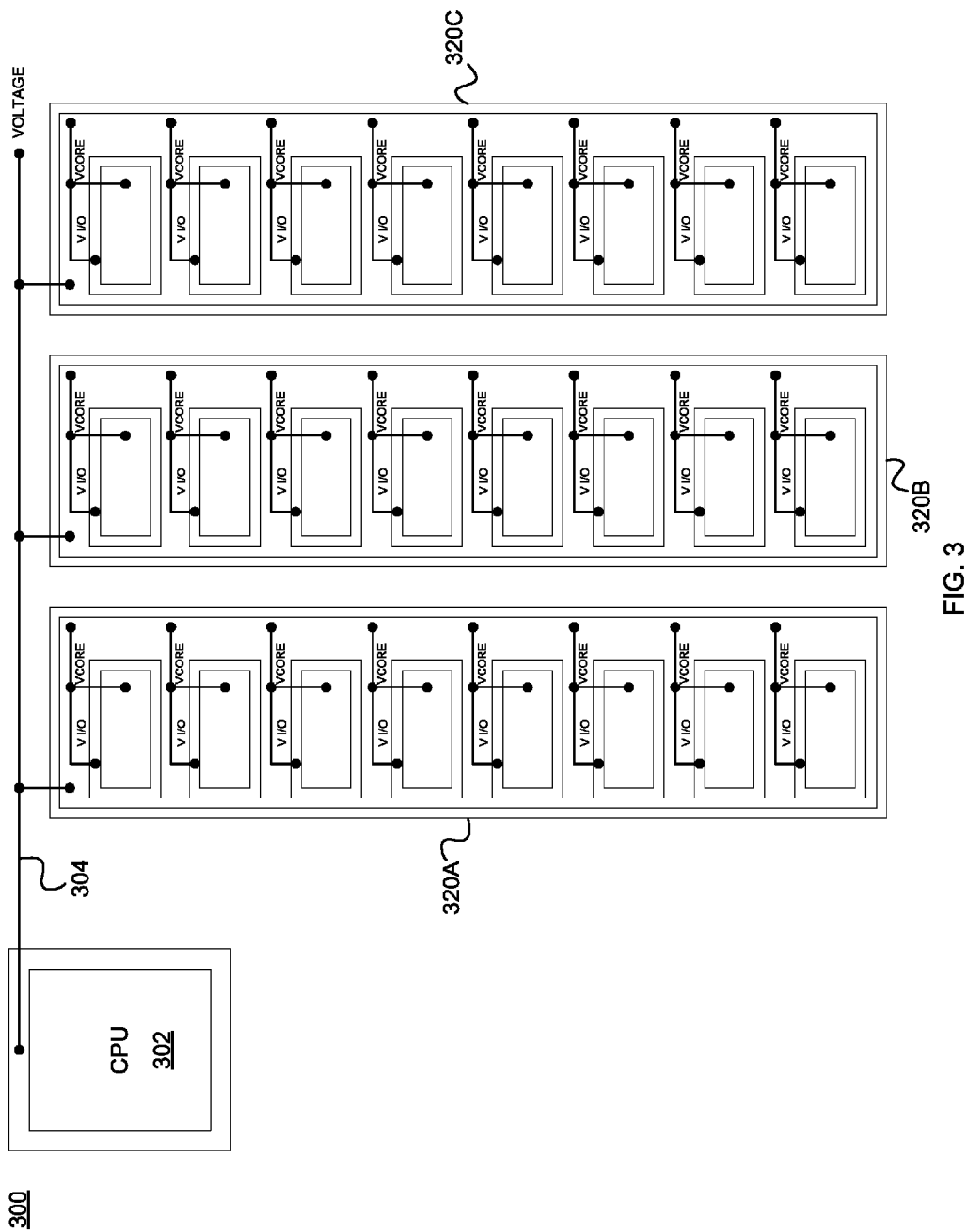
FIG. 3 is a block diagram illustrating a detailed power distribution of a memory sub-system, according to certain other embodiments.

A power distribution scheme for a CPU 302 and memory array(s) 320A-C in a memory sub-system 300 is shown in FIG. 3, according to certain other embodiments. FIG. 3 includes a connector 304 to connect to VI/Os of memory devices in the memory arrays 320, such as memory devices 215, and to connect to the VI/O of the CPU 302, all of which share the same voltage source VOLTAGE. FIG. 3 shows three memory modules 320A-C, which may for example be DRAM and which are connected to CPU 302. The DRAM devices on each memory module 320 have their VCore and VI/O voltages supplied by the source VOLTAGE. The same VOLTAGE is also connected to supply the VI/O of the CPU 302. The applied voltage is distributed to each DRAM's core and periphery via the PCB power plane and to the CPU's 302 I/O structures via the interconnect 304.

The switching performance of CMOS transistors of the DRAM integrated circuitry in each of the memory modules 320 is a function of the operating voltage. As a result, the clock speeds of DRAM integrated circuits can be increased and the access latencies reduced by raising the voltage to the DRAM device. Such techniques are used in over clocking environments, for example. Unfortunately, at higher voltages the reliability of all CMOS integrated circuits is reduced; therefore, in order to mitigate the impact on other components connected to the DRAM devices there is a need for raising the core voltage of the DRAM device without impacting the I/O voltage of the DRAM device.

FIG. 4A is a block diagram illustrating a system 400 for separating power distribution on a memory module, such as memory modules 120, 220, 320, according to some embodiments. According to certain embodiments, an intentional separation of the power distribution systems may be implemented on a memory module into two separate portions, an I/O power distribution network path 403 and a core voltage power distribution network path 407. The two separate distribution network pathways 403, 407 are driven by voltages V1 and V2 that may operate at different voltage levels. For example, the first voltage source V1 may be used to supply the power distribution network pathway 403 that operates the I/O structures on each DRAM device in each of the memory modules 320. This voltage V1 may be connected to the same voltage source (not shown) that is used for the CPU's 302 I/O interconnect and may be supplied by the system's main PCB board, according to certain embodiments.

The second voltage V2 may be used to supply voltage to the core voltage power distribution network pathway 407 that supplies the memory integrated circuit's core voltage on the memory modules 320, according to certain embodiments. This voltage V2 supplied to the power distribution network pathway 407 may be optionally derived from a voltage regulator 409. The voltage regulator 409 can reside on each memory module's 320 printed circuit board, according to certain embodiments. The voltage from the second voltage V2 may be operated at a higher voltage than the first voltage V1. The voltage regulator 409 may be configured to generate a voltage in any number of ways as will be described in detail. For example, the voltage regulator 409 may boost the voltage received from the first voltage V1. In other embodiments, the voltage regulator 409 may be enabled to supply a voltage from a range of possible voltages. In some embodiments, the magnitude of the difference between the two voltages from voltage sources V1, V2 may be limited to prevent latch-up, a common integrated circuit failure mode.

In some embodiments, voltage supplied to the voltage regulator 409 via connector 411 is the same voltage supplied to the I/O power distribution network pathway from voltage V1. In other embodiments, the voltage supplied to the voltage regulator 409 may be from another voltage source V3, which may or may not be external to the system 400. Thus, the voltage regulator 409 may receive a voltage from a voltage source that is a separate voltage source or external to the memory module or the memory system. The voltage regulator 409 may be configured to boost the voltage or drop the voltage from the external voltage source to a desired level.

According to certain other embodiments and as described previously, the DRAM device core can be over clocked by the voltage supplied by the voltage regulator 409, to raise its performance. Over clocking the DRAM device core using internal circuitry to generate higher voltages allows higher DRAM core frequency operation and lower DRAM core data access latencies, while still maintaining the DRAM I/O voltage at lower levels specified to be consistent with the CPU's I/O voltage requirements. This keeps the CPU voltage within a comfortable operating range that does not deviate from the manufacturer's specification. As a result, DRAM over clocking is possible without compromising the lifetime of the most expensive component in the overall system, the CPU.

Several block diagrams are illustrated in FIGS. 4B-4D and 5A-7B, each representing different embodiments as examples of the inventive subject matter described. Each embodiment depicts a different method of creating and/or programming the memory device core voltage.

It will be appreciated that in each of FIGS. 4B-7B, a single DRAM memory module is shown with 8 DRAM devices for illustration purposes only. Other configurations are possible. Each DRAM device 415 is depicted by two concentric rectangles. The outer rectangle 417 of each device 415 represents the I/O portion of the DRAM device 415, responsible for interface of the DRAM memory module 404 to the CPU (not shown) of the computer and is powered by VI/O at nodes 419, which in turn is supplied by a VI/O plane 413 of the DRAM memory module PCB. The VI/O plane 413 in this example is connected to a signal VOLTAGE, which may also be used to power the I/O portion of the CPU. The inner rectangle 418 of each device 415 represents a main memory storage core of each of the DRAM devices of the memory module 404, which is powered by VCore at node 441 on a VCore plane 412.

FIGS. 4B-7B represent examples of different ways in which to generate and control VCore. In some embodiments, the VCore signal is greater than VI/O. In some embodiments, memory module 404 has an independent voltage distribution for its VCore and its I/O.

Figure 4B:
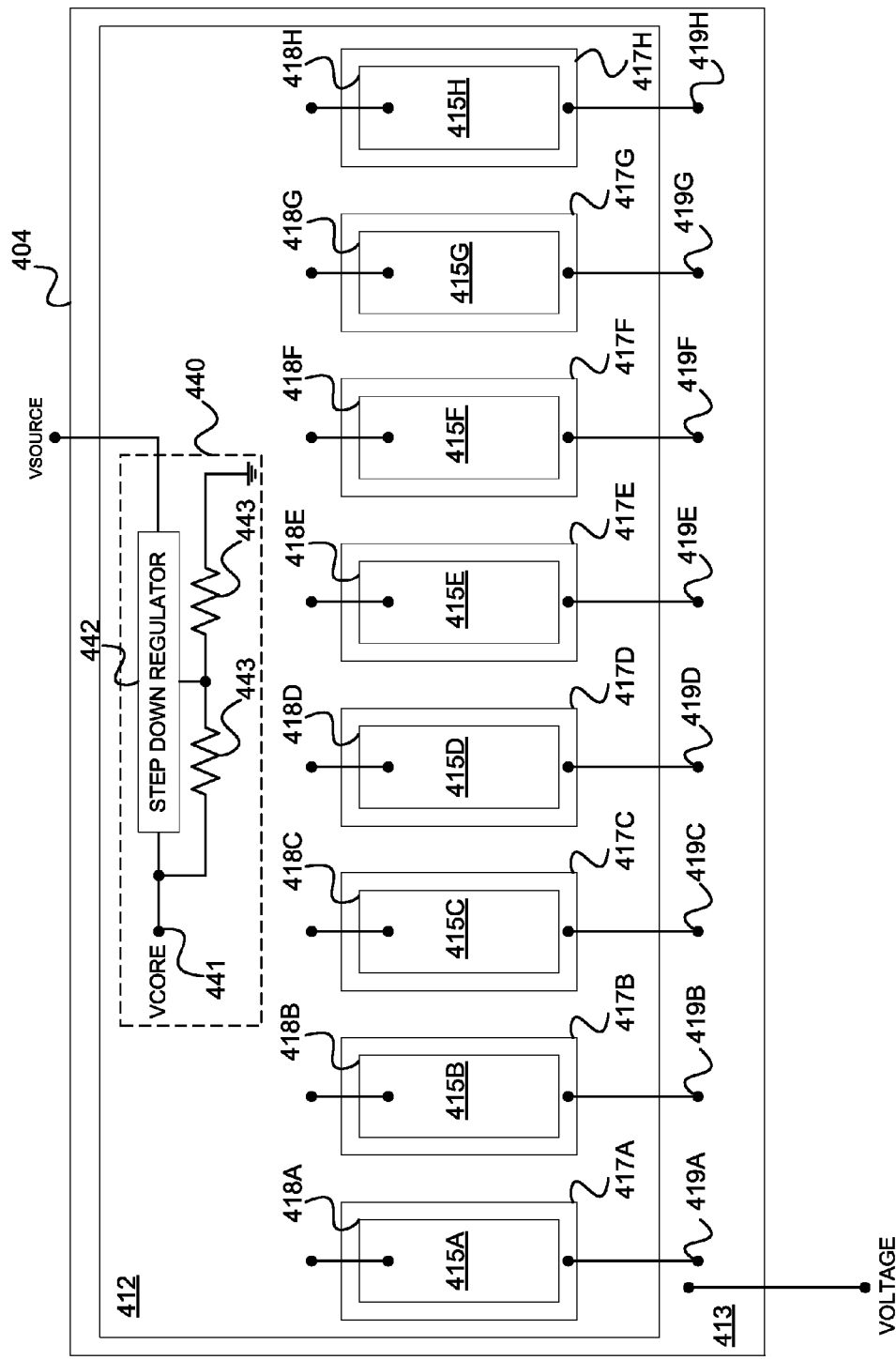

The memory module 404 of FIG. 4B additionally includes voltage control circuitry 440 having a step down voltage regulator 442 and programming resistors 443. The step down regulator 442 may be used to generate a VCore that is higher than VOLTAGE to over clock the DRAM devices 415 of memory module 404. The two resistors 443 may be used to set the output voltage of the regulator 442. It will be appreciated that the resistors 443 are used as an example of one configuration, and that other configurations and/or other components may be utilized. For example, the step down regulator 442 component may integrate the resistors 443 internally, or the voltage control circuitry 440 may be implemented with more resistors or less resistors than shown.

In some embodiments, the input voltage Vsource supplied to the step down regulator 442 may be derived from a source located off the memory module 404 that is greater than the desired VCore. Thus, the step down regulator 442 may decrease the voltage from Vsource, but still generate a voltage VCore that is higher than VOLTAGE.

Figure 4C:
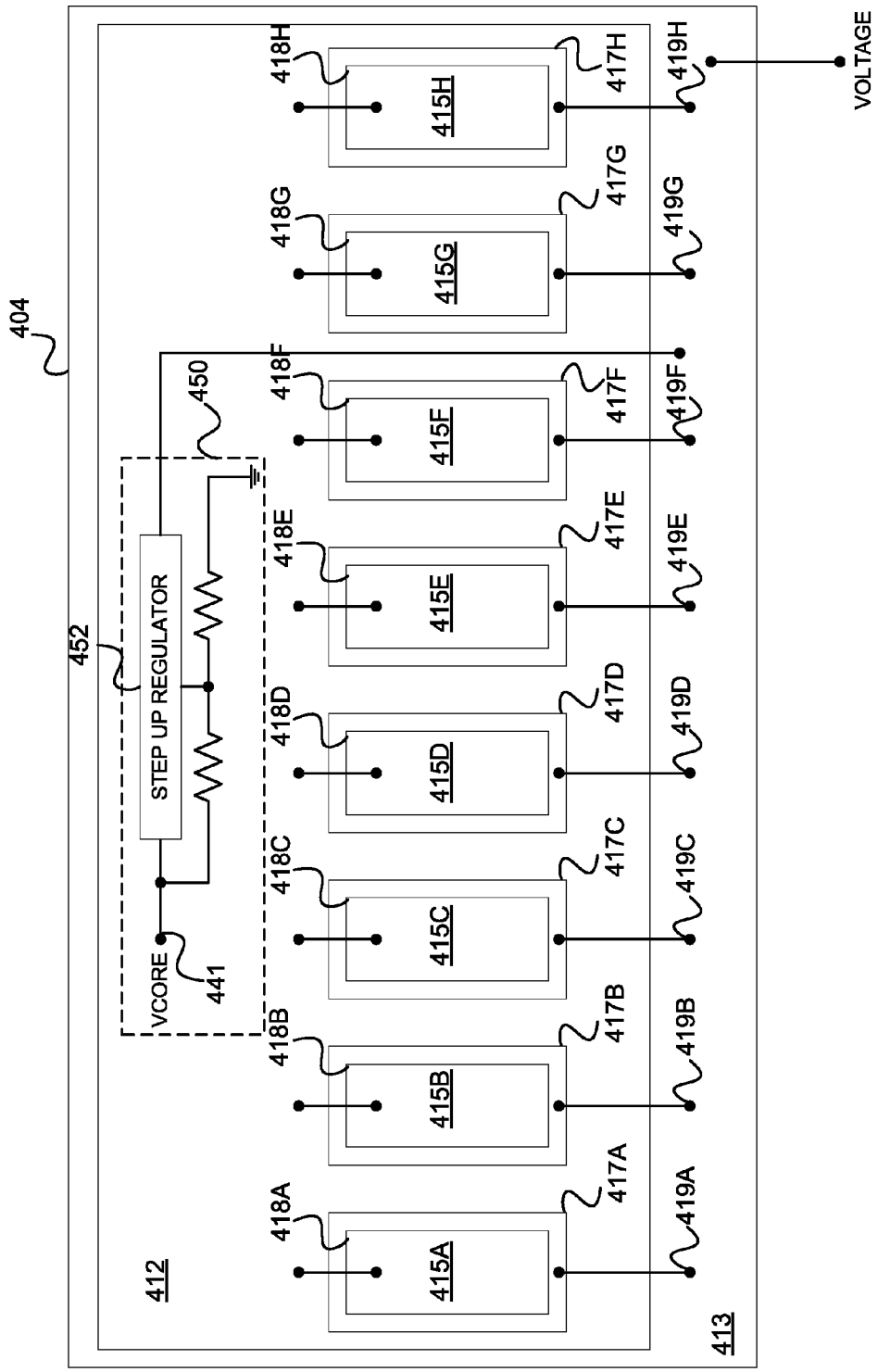

FIG. 4C is a block diagram illustrating the memory module 404 of FIG. 4B that includes a step up voltage regulator 452 in place of the step down regulator 442 of FIG. 4B in a voltage control circuit 450. In this example, the step up regulator 452 is used to generate VCore. It will be appreciated that a number of the same components of the memory module 404 of FIG. 4C are utilized, however, in the interest of brevity, these same components are not described again. In the voltage control circuit 450, the input voltage for the step up regulator 452 is derived from VI/O which is, in turn, connected to VOLTAGE. In other words, the step up regulator 452 increases the VOLTAGE level to generate a higher VCore.

Figure 4D:
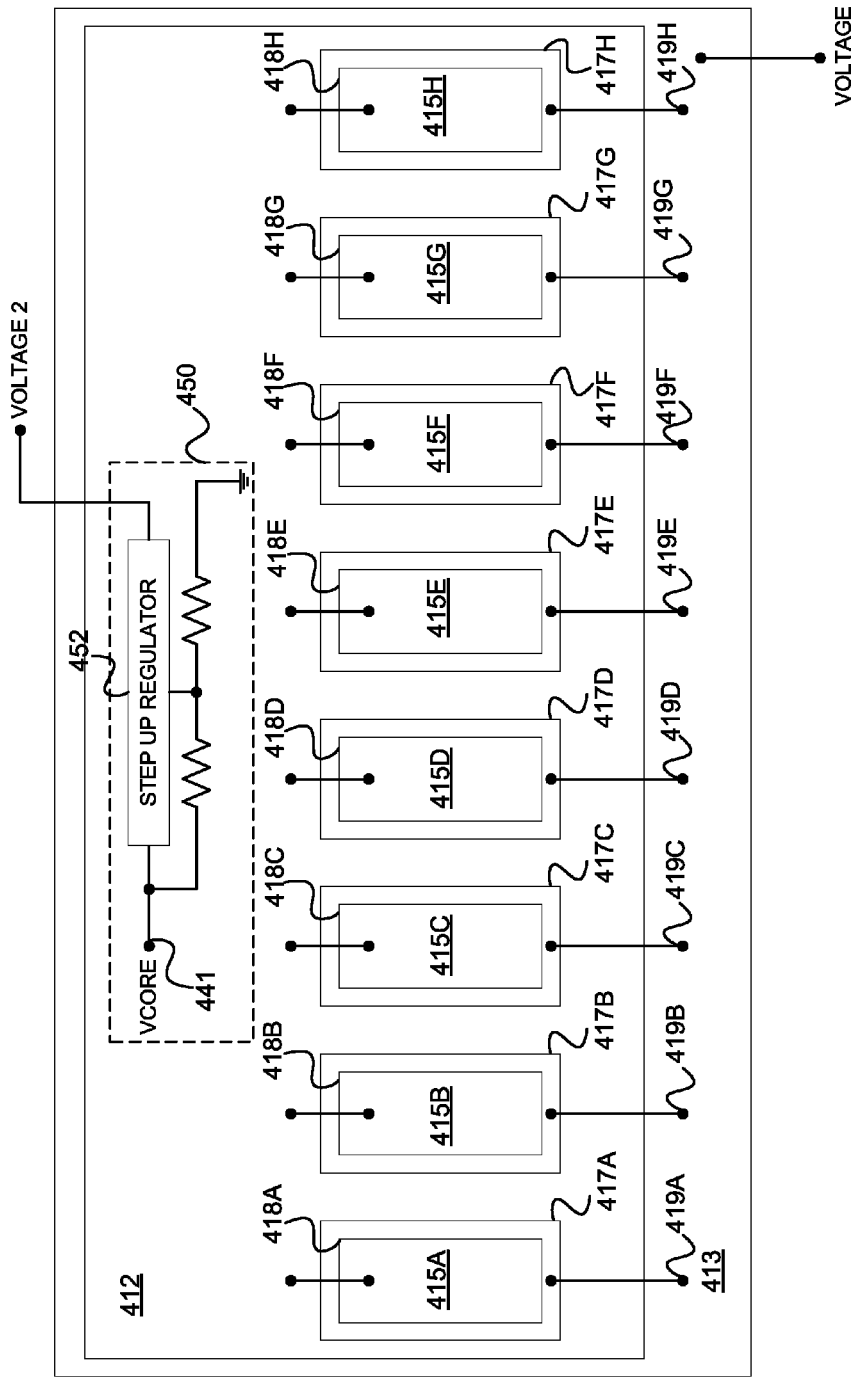

FIG. 4D is a block diagram of the memory module 404 of FIG. 4C, except that the input voltage differs. More specifically, the input voltage for the step up regulator 452 is derived from VOLTAGE 2 which is supplied from a source that is off the memory module PCB 413. It will be appreciated that the same configuration of a remote voltage source VOLTAGE 2 may be utilized with the step down regulator 442 of FIG. 4B in another embodiment.

Figure 5A:
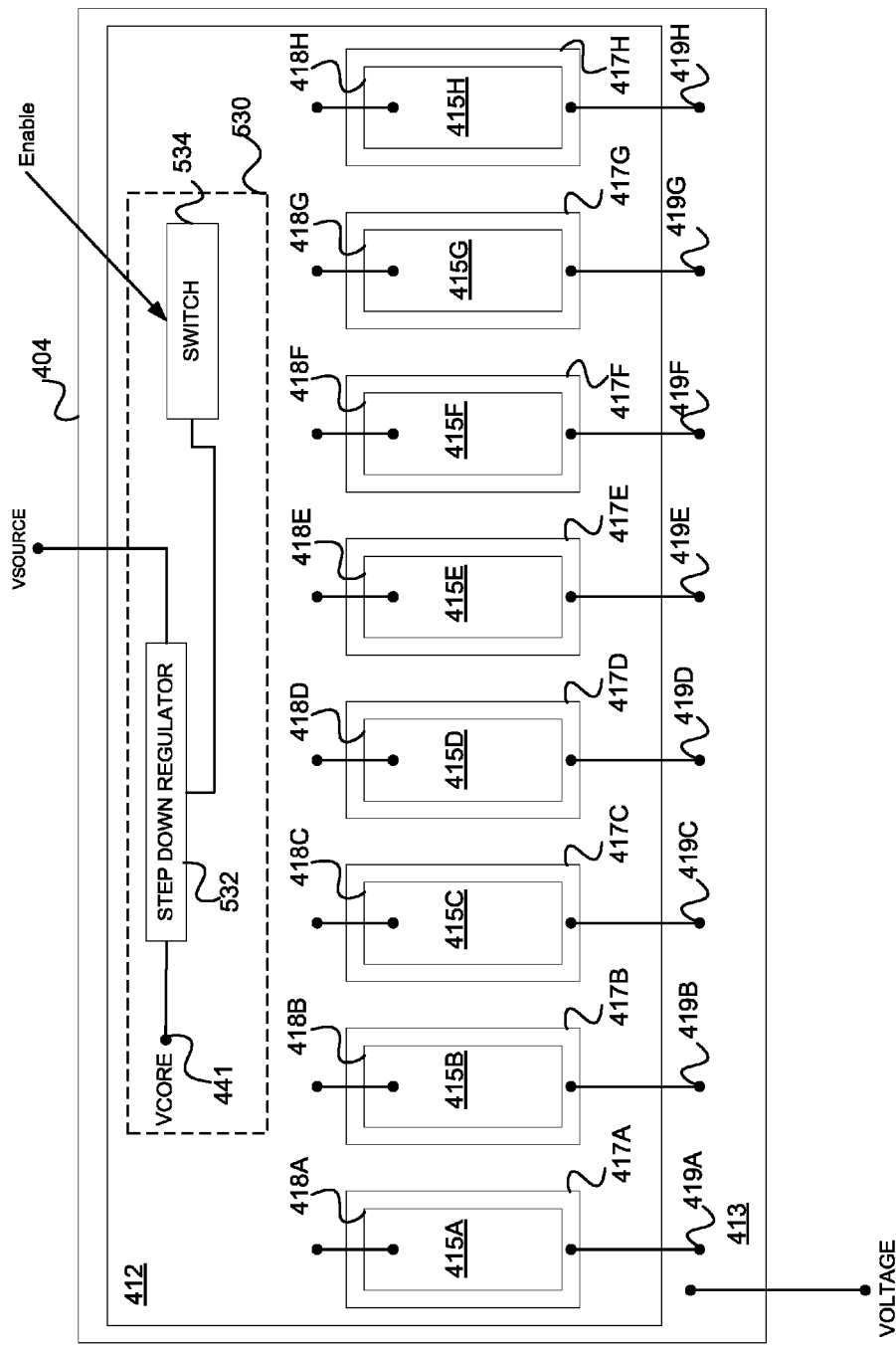
FIGS. 5A-5B are block diagrams illustrating various memory modules including an on-board voltage regulator, according to certain other embodiments.

FIG. 5A is a block diagram of the memory module 404 that includes a voltage control circuit 530, according to certain embodiments. Similar to the step down voltage regulator 442 of FIG. 4B, a step down voltage regulator 532 in the voltage control circuit 530 is utilized to generate VCore. In the voltage control circuit 530, the voltage is programmed by a switch 534, which resides on the memory module 404. The switch 534 may be turned ON in response to receiving an Enable signal. The Enable signal may be, for example, from the CPU 302 or another processor or microcontroller (not shown) from somewhere in the system. The voltage can be set in a number of discrete steps. The number of steps may be determined by the number of switch positions of the switch 534. The input voltage for the regulator may be derived from a source off the memory module 404 that is greater than the desired VCore.

Figure 5B:
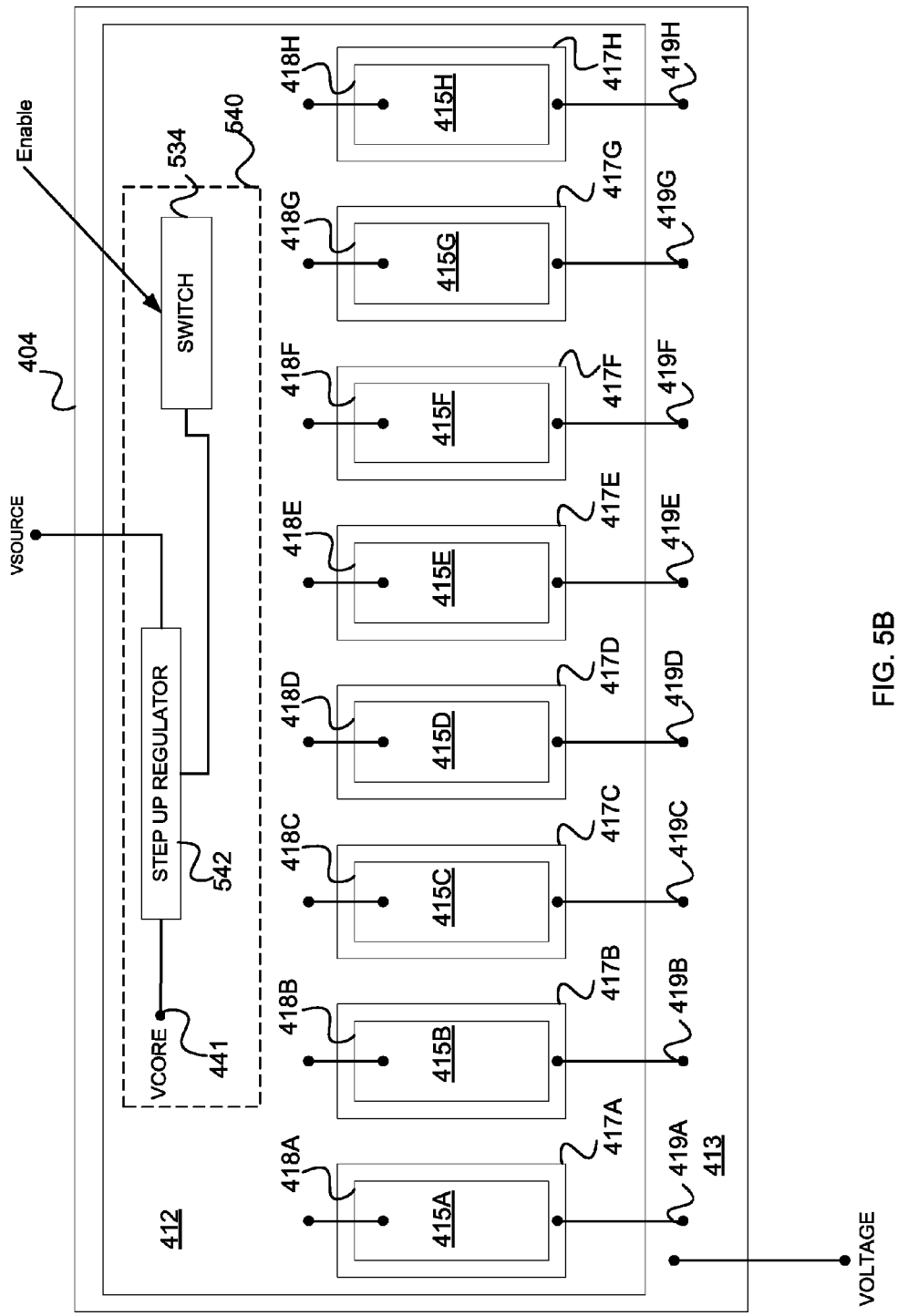

FIG. 5B is a block diagram illustrating the memory module 404 of FIG. 5A, except that a voltage control circuit 540 includes a step up voltage regulator 542 in place of the step down regulator 432 of FIG. 5A. It will be appreciated that a number of the same components of the memory module 404 of FIGS. 4B-4C and 5A are utilized, however, in the interest of brevity, these same components are not described again. As in previously described embodiments, the step up regulator 542 may be configured to increase the voltage level of the received Vsource to generate a higher VCore such that the VCore is higher than VI/O.

Figure 6A:
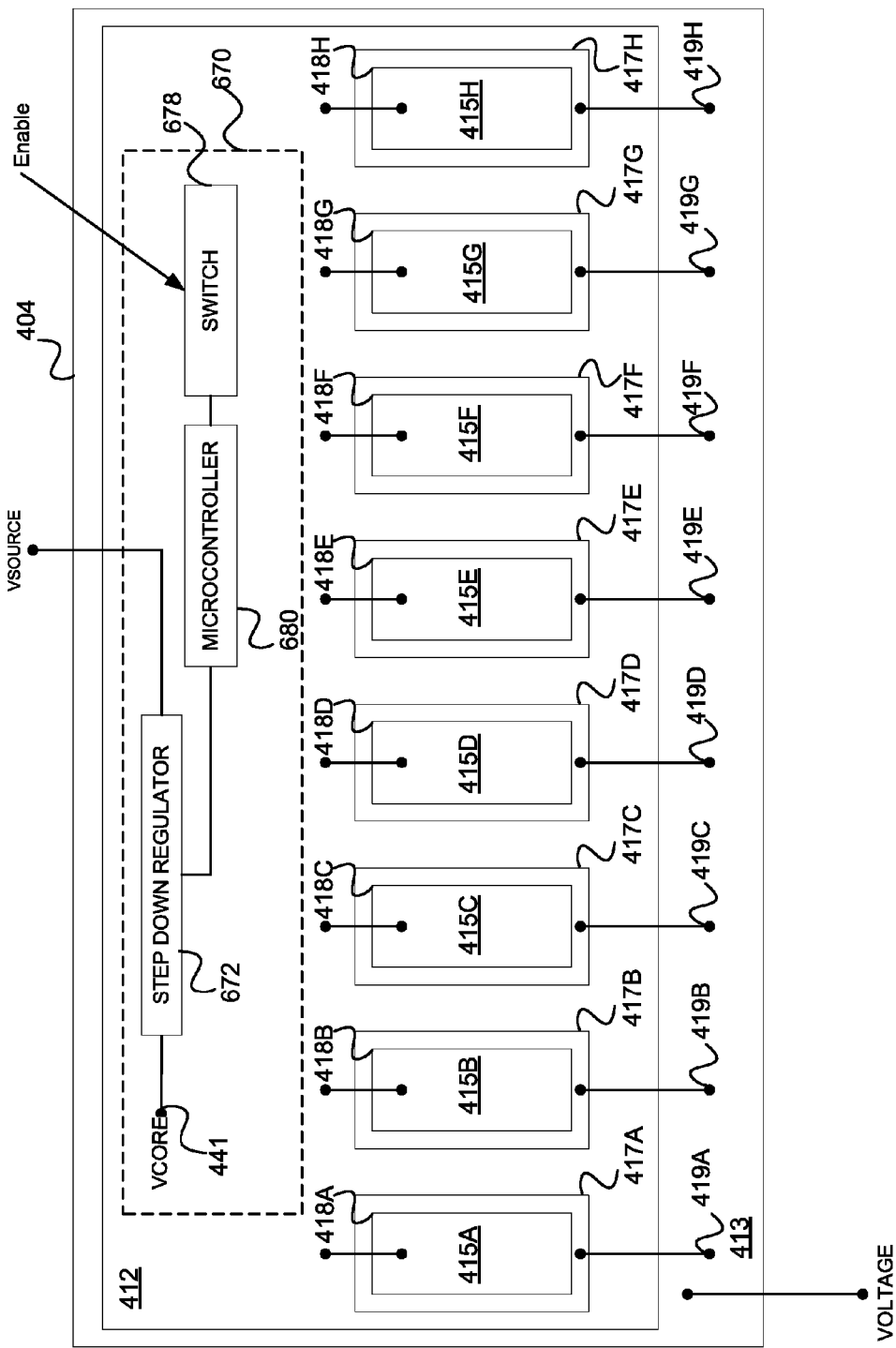
FIGS. 6A-6B are block diagrams illustrating various memory modules including an on-board voltage regulator, according to certain other embodiments.

FIG. 6A is a block diagram illustrating another embodiment of the memory module 404, where the memory module 404 includes a voltage control circuit 670 that includes mirror components as the voltage control circuit 530 of FIG. 5A, except that the voltage control circuit 670 also includes a microcontroller 680. A step down voltage regulator 672 of the voltage control circuit 670 is used to generate VCore, but the voltage may be programmed by the microcontroller 680. In some embodiments, the microcontroller 680 can be programmed by a switch 678 to set the voltage VCore. The switch 678 may reside on the memory module 404 as either part of the voltage control circuit 670 or external to the voltage control circuit 670. The switch 678 may be controlled by a control signal Enable and/or by the microcontroller 680. The voltage can be set in a number of discrete steps, which may be controlled by the microcontroller 680. The number of steps may be determined by the number of switch positions and the firmware programmed into the microcontroller 680. The input voltage for the step down voltage regulator 672 may be derived from a source off the memory module 404 that is greater than the desired VCore.

In some embodiments, the switch 678 may be configured to set a fixed voltage difference between VI/O and VCore when controlling the microcontroller 680 to set the voltage VCore.

Figure 6B:
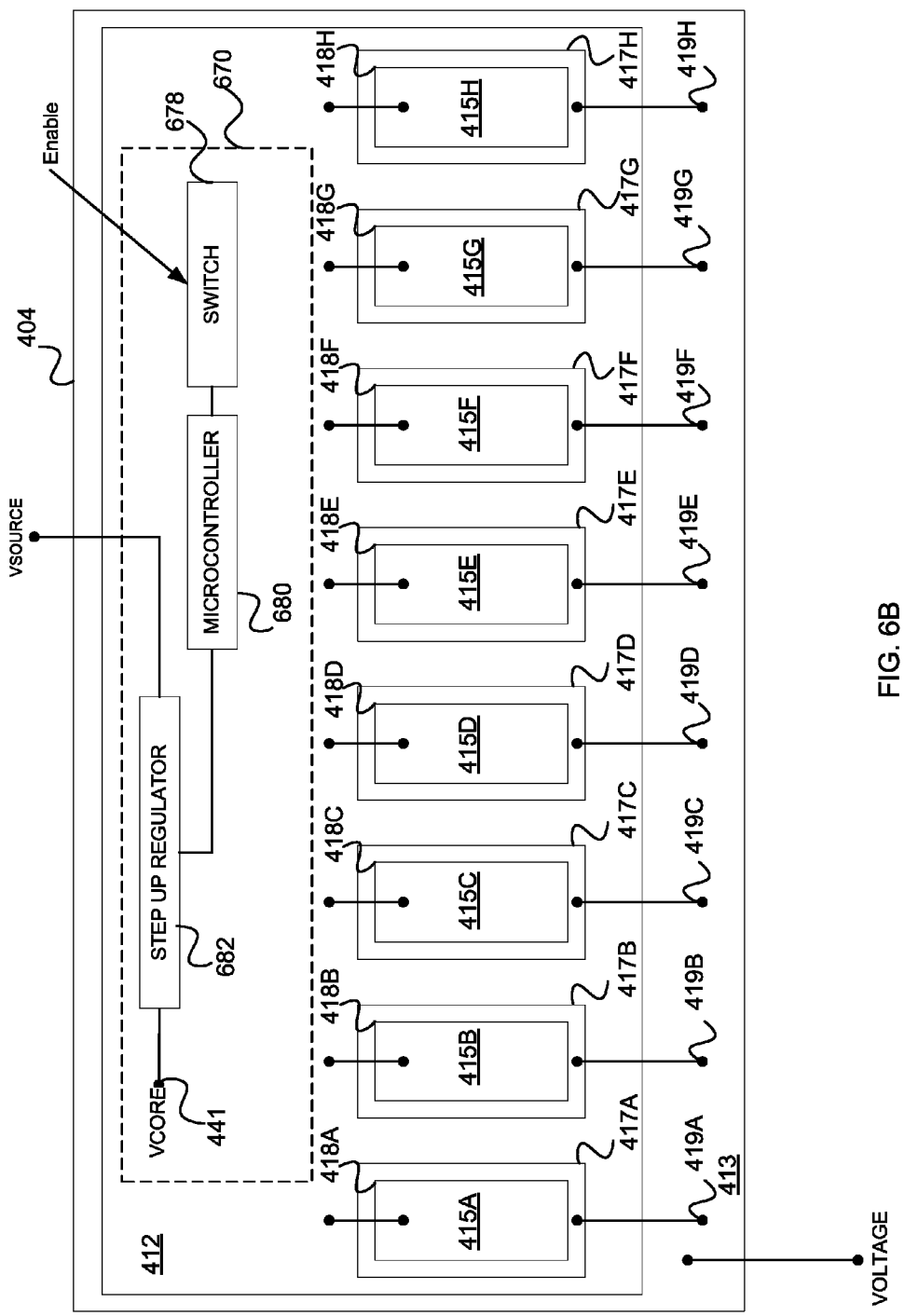

FIG. 6B is a block diagram illustrating the memory module 404 of FIG. 6A, except that the voltage control circuit 670 includes a step up voltage regulator 682 in place of the step down regulator 672 of FIG. 6A. It will be appreciated that a number of the same components of the memory module 404 of FIG. 6A are utilized, however, in the interest of brevity, these same components are not described again. As in previously described embodiments, the step up regulator 582 may be configured to increase the voltage level of the received Vsource to generate a higher VCore such that the VCore is higher than VI/O.

Figure 7A:
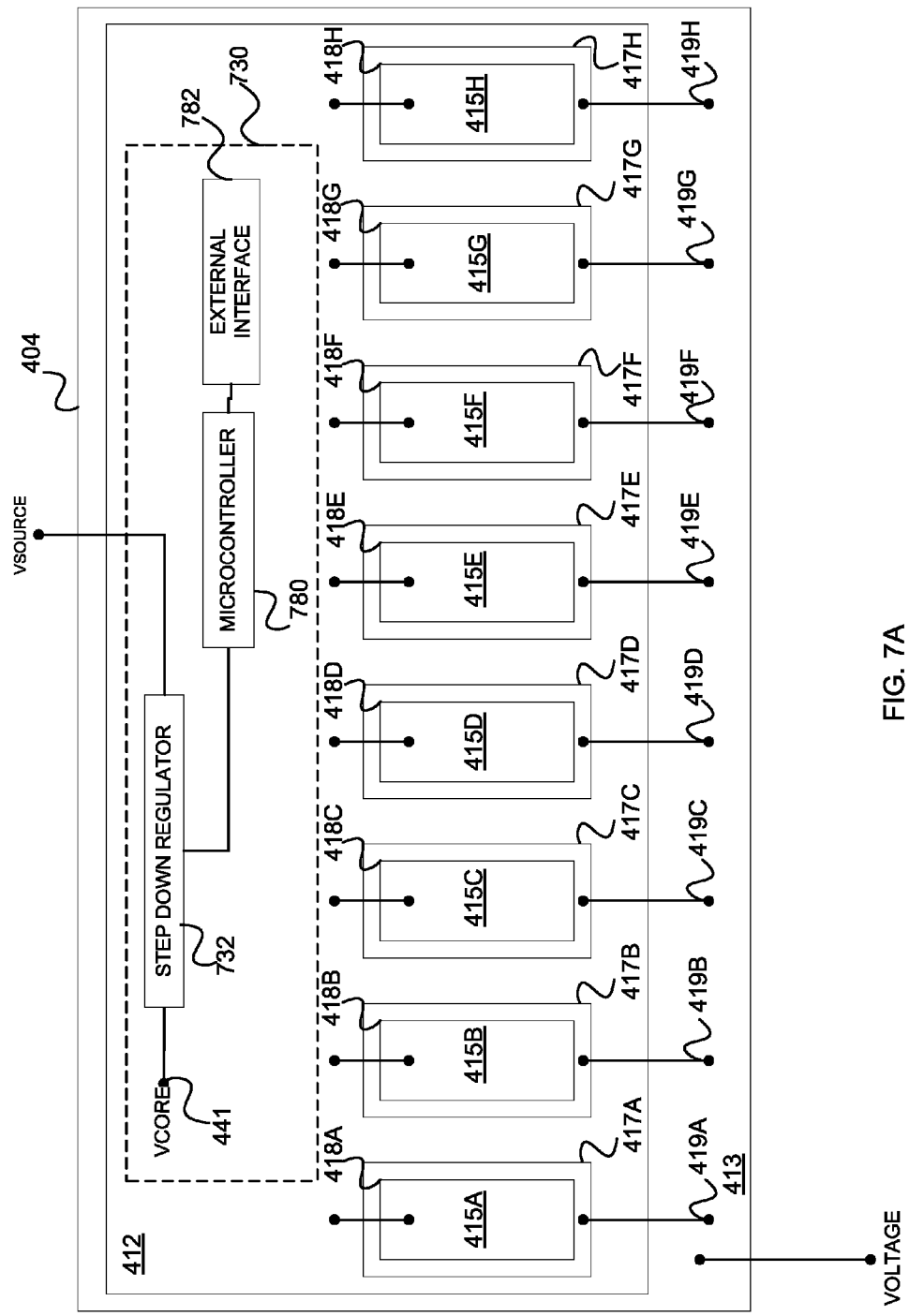
FIGS. 7A-7B are block diagrams illustrating various memory modules including an on-board voltage regulator, according to certain other embodiments.

FIG. 7A is a block diagram of the memory module 404 that includes another embodiment of a voltage control circuit 730. The voltage control circuit 730, in addition to a step down voltage regulator 732 and a microcontroller 780, includes an external interface 782 for programming VCore. In FIG. 7A, the step down regulator 732 is used to generate VCore. The voltage may be programmed by microcontroller 780, which is connected to the step down regulator 732. The microcontroller 780 may additionally be programmed by the external interface 782. The external interface 782 may be configured to receive voltage input data for setting the voltage VCore. In some embodiments, the external interface 782 may program the microcontroller 780 to set a fixed voltage difference between VI/O and VCore. The voltage can be set in a number of discrete steps. The number of steps may be determined by the firmware programmed into the microcontroller 780, as previously described. The external interface 782 may be utilized to tell the microcontroller 780 how to program the voltage. The input voltage for the step down regulator may be derived from a source off the memory module 404 that is greater than the desired VCore.

Figure 7B:
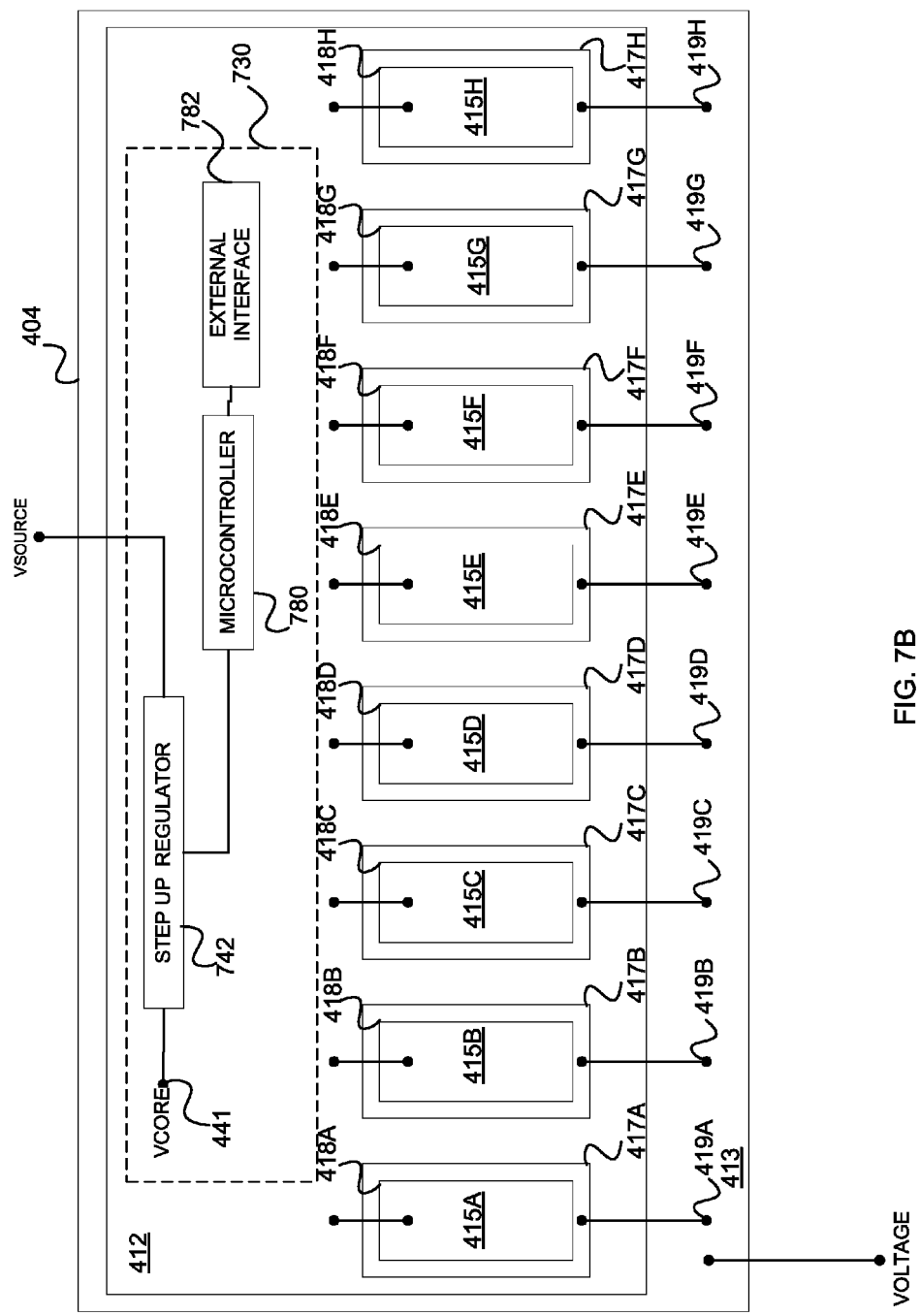

FIG. 7B is a block diagram illustrating the memory module 404 of FIG. 7A, except that the voltage control circuit 730 includes a step up voltage regulator 742 in place of the step down regulator 732 of FIG. 7A. It will be appreciated that a number of the same components from the memory module 404 of FIG. 7A are utilized, however, in the interest of brevity, these same components are not described again. As in previously described embodiments, the step up regulator 742 may be configured to increase the voltage level of the received Vsource to generate a higher VCore such that the VCore is higher than VI/O.

It will be appreciated that all voltages depicted on FIGS. 1-7B are referenced to a common ground connection (not shown). It will further be appreciated that any circuit capable of regulating a voltage may be utilized as a "voltage regulator". Examples of a voltage regulator include, but are not limited to, an onboard or external buck regulator, an onboard or external boost regulator, an onboard or external linear regulator, and so on. Specific components may also be utilized in addition to or in place of the above voltage regulators described. Components include, but are not limited to, one or more fixed resistors, amplifiers, transistors, capacitors, and so on.

The core voltage of the memory modules 404 may be programmed or configured by any means. In some examples, one or more switches may be utilized for selecting between multiple sets of fixed resistors to set the core voltage VCore. In other examples, additional circuitry may be utilized that compares the different voltages and/or forces a fixed voltage difference between VI/O and VCore. In some embodiments, circuitry may be utilized that forces a voltage difference between VI/O and VCore with the difference value based on an arbitrary mathematical function of VI/O can be used.

In some embodiments, a circuit that clamps VCore to a predetermined maximum safe limit may be utilized. In other embodiments, a circuit that only allows VCore to rise after VI/O has reached a predetermined limit may be utilized. In other embodiments, a circuit that only allows VCore to fall after VI/O has dropped below a predetermined limit can be used. In yet other embodiments, circuitry that activates a voltage control circuit (for generating VCore) when VI/O exceeds some threshold can be used. In yet other embodiments, a circuit that de-activates a voltage control circuit when VI/O drops below some threshold can be used.

According to certain embodiments, a circuit that allows pre-biasing of VCore from VI/O or any other voltage source, preferably through a diode or controllable Mosfet can be used. This would be used to limit the voltage difference between Vcore and VI/O during a startup phase, before the Vcore generating circuit is activated.

Figure 8:
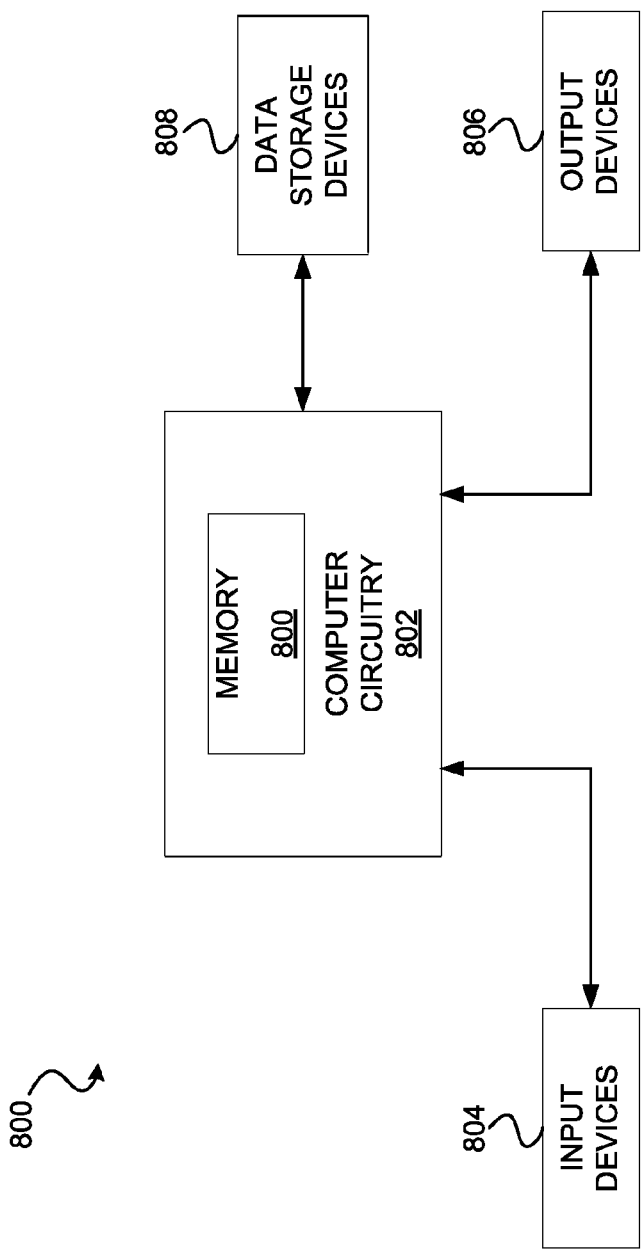
FIG. 8 is a block diagram illustrating a computer system including the memory device of any one of FIGS. 4-7.

FIG. 8 is a block diagram illustrating a computer system 800 that includes the memory sub-systems and/or the memory modules of any one of FIGS. 4A-7B. The computer system 800 may include, but is not limited to, personal computers, laptops, tablets, portable devices such as cell phones, digital cameras, PDAs and other compact, hand-held devices. Typically, the computer circuitry 802 is coupled through address, data, and control buses to the memory 800 as previously described. Memory 800 may be configured for effecting any of functions or combination of functions described above. The computer circuitry 802 may additionally include circuitry for performing various computing functions, such as executing specific software to perform specific calculations or tasks. In addition, the computer system 800 may include one or more input devices 804, such as a keyboard or a mouse, coupled to the computer circuitry 802 to allow an operator to interface with the computer system. The computer system 800 may include one or more output devices 806 coupled to the computer circuitry 802, such as output devices typically including a printer and a video terminal. One or more data storage devices 808 may also be coupled to the computer circuitry 802 to store data or retrieve data from external storage media (not shown). Examples of typical storage devices 808 include hard and floppy disks, tape cassettes, compact disk read-only (CD-ROMs) and compact disk read-write (CD-RW) memories, digital video disks (DVDs), and Flash memory and other nonvolatile memory devices.

Figure 9:
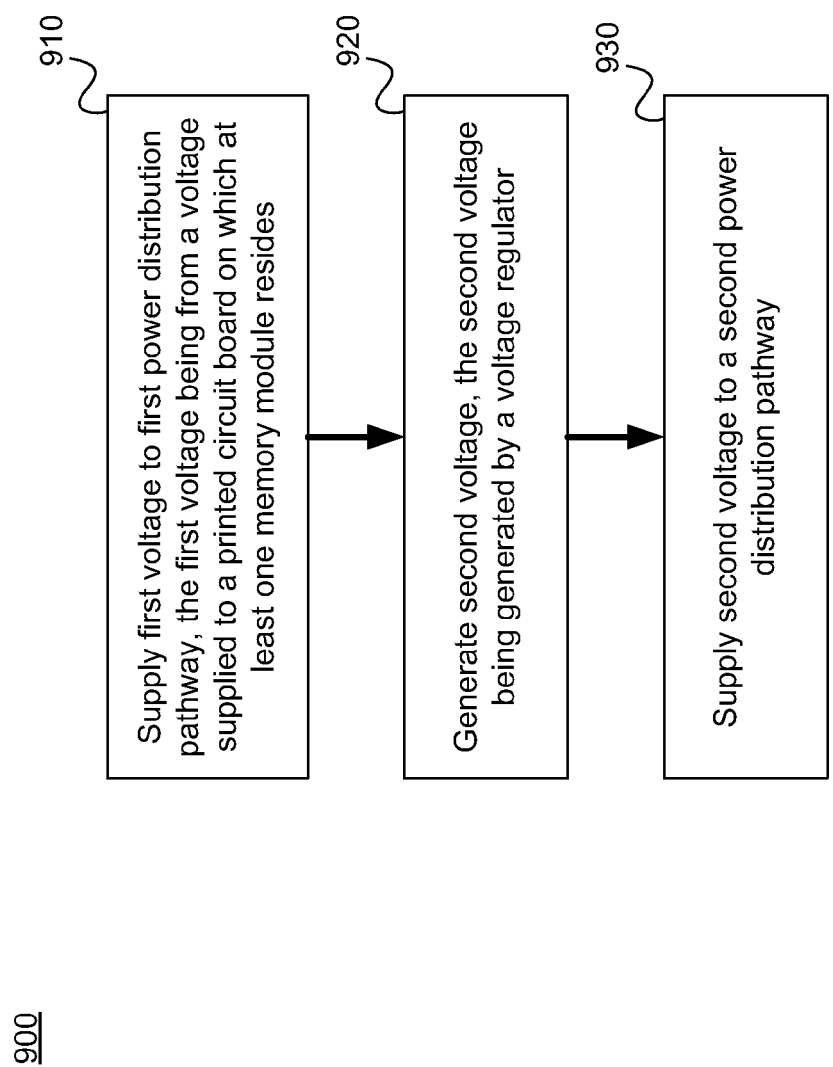
FIG. 9 is a flow chart illustrating a process for supplying power to at least one memory module, according to certain embodiments.

FIG. 9 is a flow chart 900 illustrating a process for supplying power to at least one memory module, according to certain embodiments. At step 910, a first voltage is supplied to a first power distribution pathway. The first voltage is from a voltage supplied to a printed circuit board on which the at least one memory module resides. At step 920, a second voltage is generated. The second voltage may be generated by a voltage regulator. At step 930, the second voltage is supplied to a second power distribution pathway.

The present disclosure is not to be limited in terms of the particular examples described in this disclosure, which are intended as illustrations of various aspects. Many modifications and examples may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosed subject matter is to be limited only by the terms of the appended claims, along with the full scope of equivalents to which such claims are entitled. It is to be understood that this disclosure is not limited to particular methods, systems, devices, or components, which can, of course, vary. It is also to be understood that the terminology used herein is for the purpose of describing particular examples only, and is not intended to be limiting.

What is claimed is:

1. A memory sub-system of at least one memory module, comprising:
    a first power distribution pathway configured to receive a first voltage level from a voltage source coupled to a printed circuit board on which the at least one memory module resides;
    a voltage regulator configured to receive the first voltage level and operable to generate a second voltage level, the second voltage level being higher than the first voltage level; and
    a second power distribution pathway configured to receive the second voltage level from the voltage regulator, wherein the second power distribution pathway is further configured to provide a core voltage to each of a plurality of memory devices on the at least one memory module.

2. The memory sub-system of claim 1, wherein the voltage regulator is housed on the at least one memory module.

3. The memory sub-system of claim 1, wherein the voltage regulator is configured to receive the first voltage level from the voltage source coupled to the printed circuit board.

4. The memory sub-system of claim 1, wherein the first power distribution pathway is further configured to operate I/O structures on each of a plurality of memory devices on the at least one memory module.

5. The memory sub-system of claim 1, wherein the voltage regulator is configured to receive a third voltage from an external voltage source, wherein the external voltage source is external to the at least one memory module.

6. The memory sub-system of claim 5, wherein the voltage regulator is a step down voltage regulator configured to generate the second voltage level by decreasing the third voltage level received from the external voltage source.

7. The memory sub-system of claim 1, wherein the voltage regulator is a step up voltage regulator configured to generate the second voltage level by increasing the received first voltage level.

8. The memory sub-system of claim 1, wherein the voltage regulator includes comparing circuitry to compare the first voltage level and the second voltage level and determine a voltage difference.

9. The memory sub-system of claim 8, wherein the comparing circuitry is enabled to force a predetermined voltage difference between the first voltage level and the second voltage level.

10. The memory sub-system of claim 1, further comprising at least one switch coupled to the voltage regulator and configured to program the voltage regulator to generate, as the second voltage level, a voltage from a range of voltage levels.

11. The memory sub-system of claim 1, further comprising a microcontroller coupled to the voltage regulator, the microcontroller being configured to control the level of voltage generated by the voltage regulator.

12. The memory sub-system of claim 11, further comprising a switch coupled to the microcontroller, and configured to program the microcontroller based on whether the switch is enabled or disabled.

13. The memory sub-system of claim 11, further comprising an external interface coupled to the microcontroller, the external interface configured to program the microcontroller in response to voltage input data received by the external interface.

14. A method of supplying power to at least one memory module, comprising:
   supplying a first voltage to a first power distribution pathway, the first voltage being from a voltage supplied to a printed circuit board on which the at least one memory module resides;
   generating a second voltage, the second voltage being generated by a voltage regulator; and
   supplying the second voltage to a second power distribution pathway, wherein the second power distribution pathway is configured to provide a core voltage to each of a plurality of memory devices on the at least one memory module.

15. The method of claim 14, wherein the voltage regulator is housed on the at least one memory module.

16. The method of claim 14, wherein the voltage regulator is associated with the first power distribution pathway.

17. The method of claim 14, wherein the first power distribution pathway is further configured to operate I/O structures on each of a plurality of memory devices on the at least one memory module.

18. The method of claim 14, wherein the voltage regulator is configured receive a third voltage from an external voltage source, and wherein the external voltage source is external to the at least one memory module.

19. The method of claim 18, wherein the voltage regulator is a step down voltage regulator configured to generate the second voltage level by decreasing the third voltage level received from the external voltage source.

20. The method of claim 14, wherein the voltage regulator is a step up voltage regulator configured to generate the second voltage level by increasing the received first voltage level.

21. The method of claim 14, wherein the voltage regulator includes comparing circuitry to compare the first voltage level and the second voltage level and determine a voltage difference.

22. The method of claim 21, wherein the comparing circuitry is enabled to force a predetermined voltage difference between the first voltage level and the second voltage level.

23. The method of claim 14, further comprising programming the voltage regulator to generate, as the second voltage level, a voltage from a range of voltages via at least one switch.

24. The method of claim 14, further comprising controlling the level of voltage generated by the voltage regulator via a microcontroller.

25. The method of claim 24, further comprising programming the microcontroller based on whether a switch associated with the microcontroller is enabled or disabled.

26. The method of claim 24, further programming the microcontroller in response to voltage input data received by an external interface associated with the microcontroller.

\* \* \* \* \*